(12) United States Patent
Vogelsang

(10) Patent No.: US 12,731,632 B2
(45) Date of Patent: Sep. 8, 2026

(54) SENSE AMPLIFIER FOR ACTIVE STANDBY OPERATION

(71) Applicant: Rambus Inc., San Jose, CA (US)

(72) Inventor: Thomas Vogelsang, Jericho, VT (US)

(73) Assignee: RAMBUS INC., San Jose, CA (US)

( * ) Notice: Subject to any disclaimer, the term of this patent is extended or adjusted under 35 U.S.C. 154(b) by 206 days.

(21) Appl. No.: 18/643,674

(22) Filed: Apr. 23, 2024

(65) Prior Publication Data

US 2024/0371432 A1 Nov. 7, 2024

Related U.S. Application Data

(60) Provisional application No. 63/500,331, filed on May 5, 2023.

(51) Int. Cl.
*G11C 11/4091* (2006.01)
*G11C 7/06* (2006.01)
*G11C 7/08* (2006.01)

(52) U.S. Cl.
CPC .......... *G11C 11/4091* (2013.01); *G11C 7/065* (2013.01); *G11C 7/08* (2013.01); *G11C 2207/2227* (2013.01)

(58) Field of Classification Search
CPC . G11C 11/4091; G11C 11/409; G11C 11/408; G11C 7/08; G11C 7/065; G11C 2207/2227
USPC .......................................................... 365/207
See application file for complete search history.

(56) References Cited

U.S. PATENT DOCUMENTS 6,466,499 B1 * 10/2002 Blodgett ............. G11C 11/4074 365/207
8,363,499 B2 1/2013 La Rosa
8,559,240 B2 * 10/2013 Hong ....................... G11C 7/02 365/207
9,401,185 B1 * 7/2016 Lim ......................... H03K 5/02
9,773,544 B2 9/2017 Woo et al.
10,522,205 B1 12/2019 Kawamura
10,950,279 B2 3/2021 Jeong et al.
(Continued)

OTHER PUBLICATIONS

Kotabe, Akira et al., "Asymmetric Cross-Coupled Sense Amplifier for Small-Sized 0.5V Gigabit-DRAM Arrays", IEEE Asian Solid-State Circuits Conference, Nov. 8-10, 2010, Beijing, China. 4 pages.

*Primary Examiner* — Sung Il Cho
(74) *Attorney, Agent, or Firm* — Amsel IP Law PLLC; Jason Amsel

(57) ABSTRACT

A sense amplifier for a memory device includes a primary latch and a holding latch that are independently controllable. The primary latch comprises a first set of transistors and the holding latch includes a second set of transistors having higher threshold voltages than the first set of transistors. In conjunction with a memory access operation, the primary latch and the holding latch sense and amplify a differential voltage of a pair of bitlines. A connectivity control circuit controls connectivity of the primary latch in different operational modes including pre-charge, offset pre-compensation, and amplification. In an active idle mode in between memory access operations while the wordline may remain active, the connectivity control circuit may turn off the primary latch while the holding latch holds the differential voltage on the bitlines to avoid leakage current through the primary latch.

17 Claims, 4 Drawing Sheets

(56) References Cited

U.S. PATENT DOCUMENTS

| | | | | |
|---|---|---|---|---|
| 11,295,788 | B2 | 4/2022 | Ku | |
| 11,423,957 | B2 | 8/2022 | Peng et al. | |
| 2010/0149895 | A1* | 6/2010 | Kim | G11C 15/046 365/207 |
| 2023/0005522 | A1* | 1/2023 | Chi | G11C 5/025 |

* cited by examiner

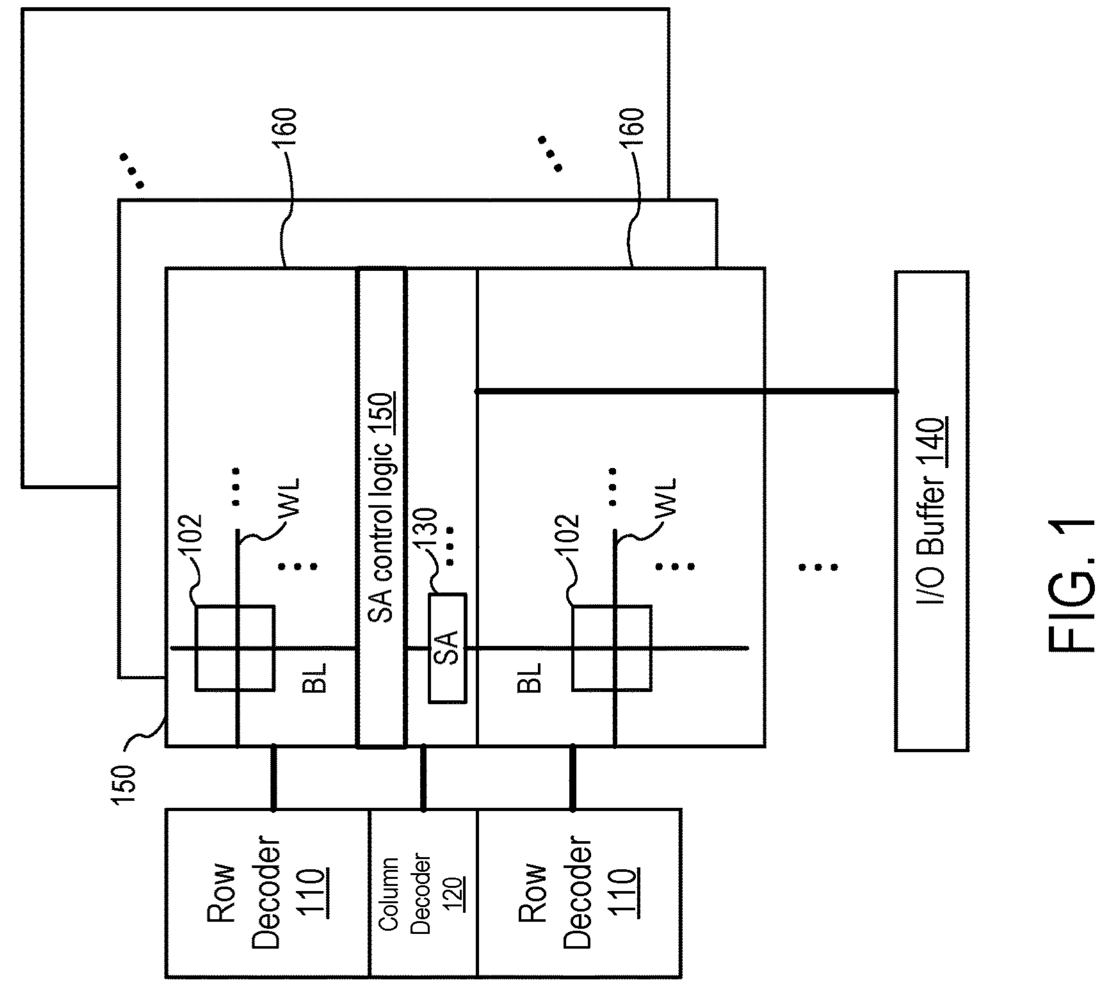
FIG. 1
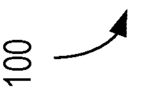

SENSE AMPLIFIER FOR ACTIVE STANDBY OPERATION

CROSS-REFERENCE TO RELATED APPLICATIONS

This application claims the benefit of U.S. Provisional Patent Application No. 63/500,331 filed on May 5, 2023, which is incorporated by reference herein.

BACKGROUND

Memory devices such as Dynamic Random-Access Memory (DRAM) typically include an array of memory cells and supporting logic circuitry for facilitating memory operations. In such devices, sense amplifiers may be used during read and write operations to sense and amplify signals representing data to be written to or read from memory cells.

BRIEF DESCRIPTION OF THE DRAWINGS

The teachings of the embodiments herein can be readily understood by considering the following detailed description in conjunction with the accompanying drawings.

FIG. 1 is an example architecture of a memory device.

DETAILED DESCRIPTION

Figure 2:
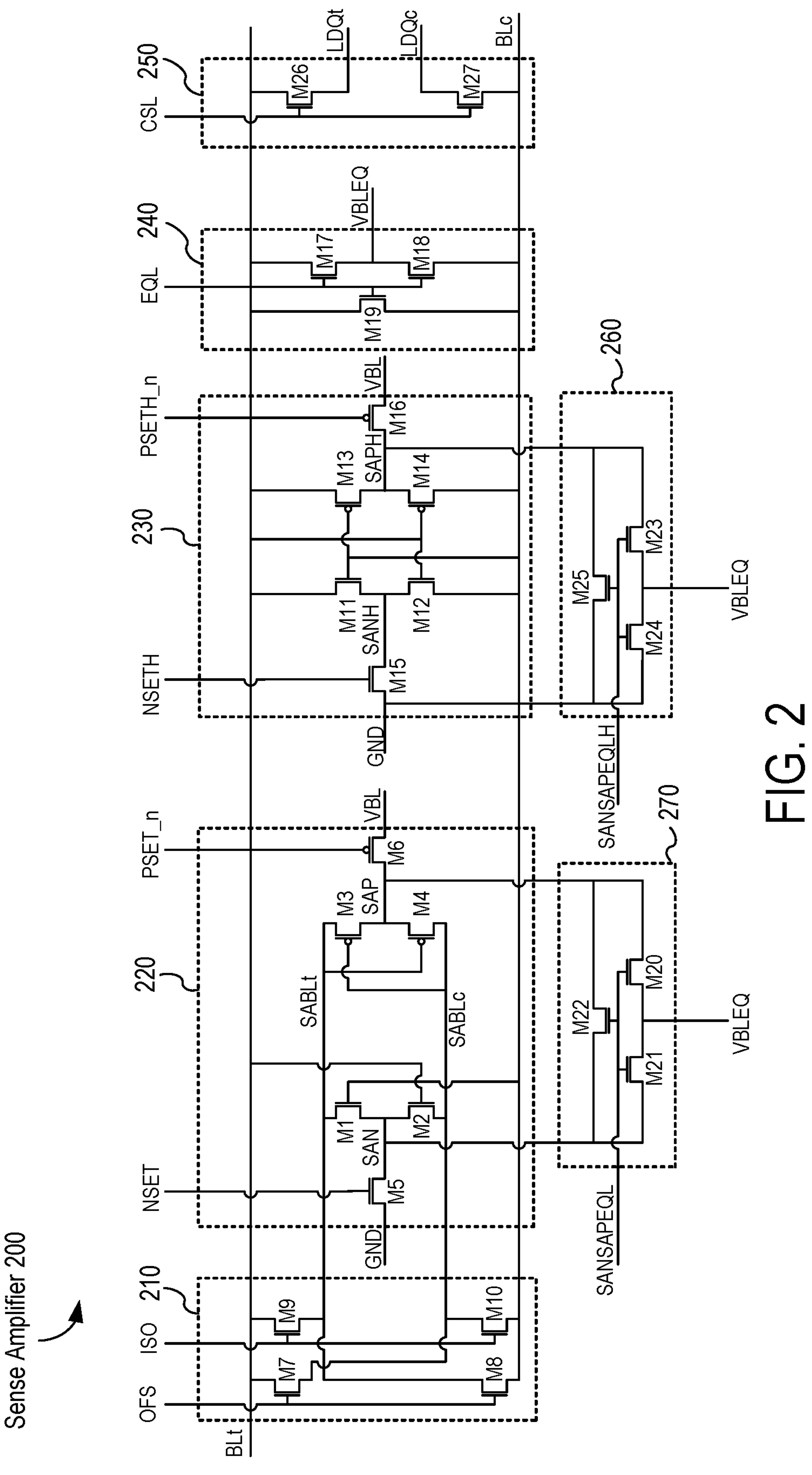
FIG. 2 is an example architecture of a sense amplifier for a memory device.

A sense amplifier for a memory device includes a primary latch and a holding latch that are independently controllable. The primary latch comprises a first set of transistors and the holding latch includes a second set of transistors having higher threshold voltages than the first set of transistors. In conjunction with a memory access operation, the primary latch and the holding latch sense and amplify a differential voltage of a pair of bitlines. A connectivity control circuit controls connectivity of the primary latch in different operational modes including pre-charge, offset pre-compensation, and amplification. In an active idle mode in between memory access operations while the wordline may remain active, the connectivity control circuit may turn off the primary latch while the holding latch holds the differential voltage on the bitlines to avoid leakage current through the primary latch.

FIG. 1 is an example embodiment of a memory device 100. The memory device 100 may comprise, for example, a dynamic random-access memory (DRAM). The memory device 100 comprises an array of memory cells 102 organized into banks 150, one or more row decoders 110, a column decoder 120, a set of sense amplifiers 130, and an input/output (I/O) buffer 140. The row decoder 110 and column decoder 120 may be shared between multiple banks 150 in some embodiments. Furthermore, each of the sense amplifiers 130 may be shared between two or more columns in some embodiments. The memory device 100 may include additional circuitry omitted from the drawing.

Within a bank 150, each row of memory cells 102 is coupled to a wordline WL and each column of memory cells 102 is coupled to a bitline BL. The rows of memory cells 102 may be organized into two or more sub-arrays 160 on opposite sides of the sense amplifiers 130. While the example in FIG. 1 shows only two sub-arrays 160, each bank 150 may include any number of sub-arrays 160 in similar configurations. Each sense amplifier 130 is connected to a pair of bitlines BL, one bitline BL from each of the adjacent sub-arrays 160 corresponding to the same column. In a memory operation, one of the bitlines BL in each pair that is coupled with the activated wordline WL is designated as a true bitline BLt and the other bitline BL in the pair (coupled to the same sense amplifier 130) is designated as a complementary bitline BLc. For read and write operations, the true bitline BLt transmits a voltage indicative of the logic level of the bit being read or written, while the complementary bitline BLc transmits a voltage indicative of the complementary logic level.

In a read operation, the row decoder 110 activates a selected wordline WL of an active bank 150 to cause each of the memory cells 102 in the row to be connected to their respective bitlines BL. The wordlines WL of all other cells 102 on both bitlines BL of the pair connected to the sense amplifier 130 are not activated and these cells are not connected to the bitlines BL. The voltages stored in the cells 102 of the activated row change the voltages of the bitlines BL they are connected to (which operate as the true bitlines BLt), thereby creating voltage differences relative to the other bitlines BL of the pair connected to each sense amplifier 130 (which operate as the complementary bitlines BLc). These voltage differences are sensed and amplified by respective sense amplifiers 130 to generate digital output signals corresponding to the logic levels of the data stored in the activated cells 102. The column decoder 120 selects an output from one of the sense amplifiers 130 and sends the selected output to the I/O buffer 140 for outputting to a host processor or other device.

In a write operation, the data to be written to a bank 150 is sent through the I/O buffer 140 to the sense amplifiers 130. The column decoder 120 selects one or more columns and the row decoder 110 activates a selected wordline WL associated with one or more memory addresses for writing the data. The sense amplifiers 130 amplify the data signals on the bitlines BL to maintain the appropriate voltage levels as the data is written to the activated cells 102.

In between memory accesses, the memory device 100 may either deactivate the wordline WL and operate in a standby mode, or may leave the wordline WL open and operate in an active idle mode. In the standby mode, power to the bank (including the sense amplifiers 130) is deactivated to conserve power. Upon reactivating the bank 150 for a subsequent memory access, the sense amplifiers 130 pre-charge the respective bitline pairs BLt, BLc to a predefined equalization voltage (e.g., halfway between the logic levels or Vdd/2) in preparation for the next memory access. As will be described in further detail below, the sense amplifiers 130 may furthermore perform an offset pre-compensation operation in between pre-charging and activating the wordline WL. During offset pre-compensation, the sense amplifiers 130 operate to generate a compensating differential voltage on the bitline pairs BLt, BLc to compensate for offsets in the sense amplifiers 130 that may affect sensing during a subsequent memory access.

In an active idle mode, a wordline WL may remain active between consecutive memory accesses to avoid activation power associated with reactivation. The active idle mode may enable multiple memory accesses to be performed on the same row without performing pre-compensation and pre-charging operations in between the memory operations. As described in further detail below, an embodiment of the sense amplifiers 130 may enable an active idle mode that results in reduced leakage current of the sense amplifier 130 (i.e., a low leakage mode) relative to a normal active idle mode.

The sense amplifier control logic 150 may generate various control signals to control functions of the sense amplifiers 130. For example, as described in further detail below, the sense amplifier control logic 150 may generate signals to control pre-charging, offset pre-compensation, amplification, and active idle operation (including the low leakage mode) of the sense amplifiers 130. As will be further described below, at least some of the sense amplifier control logic 150 and associated control signals may be shared between two or more sense amplifiers 130.

FIG. 2 is an example embodiment of a sense amplifier 200 for a memory device 100. During a memory access, the sense amplifier 200 senses and amplifies a differential voltage of a bitline pair BLt, BLc to facilitate read or write operations. The sense amplifier 200 may furthermore perform offset pre-compensation and pre-charging functions as described further herein. In an embodiment, the sense amplifier 200 includes a connectivity control circuit 210, a primary latch 220, a holding latch 230, a bitline equalization circuit 240, a primary latch equalization circuit 270, a holding latch equalization circuit 260, and a column select circuit 250.

The connectivity control circuit 210 controls a connectivity configuration of an input sense amplifier bitline pair SABLt, SABLc of the primary latch 220 with respect to the bitline pair BLt, BLc. In an amplification mode, the connectivity control circuit 210 couples the bitlines BLt, BLc to the sense amplifier bitlines SABLt, SABLc with matching polarity such that the true bitline BLt couples to the true sense amplifier bitline SABLt and the complementary bitline BLc couples to the sense amplifier complementary bitline SABLc. In an offset pre-compensation mode, the connectivity control circuit 210 reverses the polarity of the connection such that the true bitline BLt couples to the complementary sense amplifier bitline SABLc and the complementary bitline BLc couples to the true sense amplifier bitline SABLt. In a low leakage mode of an active idle state, the connectivity control circuit 210 may decouple the sense amplifier bitlines SABLc, SABLt from the bitlines BLt, BLc such that the sense amplifier bitlines SABLc, SABLt are floating.

The connectivity control circuit 210 may be implemented as a pair of offset cancellation switches M7, M8 (e.g., transistors) controlled by an offset pre-compensation signal OFS and a pair of isolation switches M9, M10 (e.g., transistors) controlled by an isolation signal ISO. The first offset cancellation switch M7 is coupled between the true bitline BLt and the complementary sense amplifier bitline SABLc and the second offset cancellation switch M8 is coupled between the complementary bitline BLc and the true sense amplifier bitline SABLt. The first isolation switch M9 is coupled between the true bitline BLt and the true sense amplifier bitline SABLt and the second isolation switch M10 is coupled between the complementary bitline BLc and the complementary sense amplifier bitline SABLc.

When configured for amplification, the primary latch 220 amplifies and latches a differential voltage of the bitlines BLt, BLc. For example, when a positive differential voltage is present on the bitlines BLt, BLc, the primary latch 220 amplifies the positive differential voltage until it stabilizes at a positive reference voltage VBL representing a first logic level (e.g., a binary “1”). When a negative differential voltage is present on the bitlines BLt, BLc, the primary latch 220 operates to amplify the differential voltage until it stabilizes at a negative reference voltage GND, representing a second logic level (e.g., a binary “0”).

In an embodiment, the primary latch 220 may be implemented as a cross-coupled latch including a pair of n-type transistors and a pair of p-type transistors. The n-type pair includes a first n-type transistor M1 coupled between the sense amplifier true bitline SABLt and a sense amplifier negative reference node SAN, and a second n-type transistor M2 coupled between the sense amplifier negative reference node SAN and the complementary sense amplifier bitline SABLc. The first n-type transistor M1 is controlled by the complementary bitline BLc and the second n-type transistor M2 is controlled by the true bitline BLt. The p-type pair includes a first p-type transistor M3 coupled between the sense amplifier true bitline SABLt and a sense amplifier positive reference node SAP, and a second p-type transistor M4 coupled between the sense amplifier positive reference node SAP and the complementary sense amplifier bitline SABLc. The first p-type transistor M3 is controlled by the sense amplifier complementary bitline SABLc and the second n-type transistor M4 is controlled by the sense amplifier true bitline SABLt.

A first control switch M5 (e.g., an n-type transistor) is coupled between the sense amplifier negative reference node SAN and ground GND, and a second control switch M6 (e., a p-type transistor) is coupled between the sense amplifier positive reference node SAP and the positive reference voltage VBL. The first control switch M5 and the second control switch M6 are controlled by control signals NSET, PSET_n respectively.

In the offset pre-compensation mode, the signal OFS is on and the isolation signal ISO is off to connect the bitline BLt, BLc and the sense amplifier bitlines SABLt, SABLc with reversed polarity. The control signals NSET, PSET_n may turn on the control switches M5, M6 in the offset compensation mode so that the positive and negative reference terminals SAP, SAN are connected to VBL and GND respectively. In this configuration, the wordlines WL are not activated and no cell 102 is connected to the bitlines BLt, BLc. The differential voltage of the sense amplifier bitlines SABLt, SABLc is driven by the mismatch of the sense amplifier transistors M1, M2, M3, M4 opposite to the direction the same mismatch will drive the transistors M1, M2, M3, M4 in amplification mode because of the reversed connectivity configuration.

In the amplification mode, the offset pre-compensation signal OFS is off and the isolation signal ISO is on. Here, a differential voltage of the bitlines BLt, BLc, and the sense amplifier differential bitlines SABLt, SABLc are coupled directly with matching polarity. After activating the worldline, the control switches M5, M6 turn on, thereby enabling the primary latch 220 to amplify the differential input voltage on the bitlines BLt, BLc.

In a low leakage mode of the active idle state, described further below, the offset pre-compensation signal OFS and isolation signal ISO may turn off the isolation switches M9, M10 and offset pre-compensation control switches M7, M8 as well as control switches M5 and M6 such that the sense amplifier bitlines SABLt, SABLc and the reference nodes SAN and SAP are floating. This mode reduces or eliminates leakage current through the transistors M1, M2, M3, M4 of the primary latch 220.

The holding latch 230, when enabled, operates similarly to the primary latch 220 in the amplification mode to amplify and latch the differential voltage on the bitlines BLt, BLc. The holding latch 230 may include a pair of n-type transistors and a pair of p-type transistors in a cross-coupled latch configuration. The n-type pair includes a first n-type transistor M11 coupled between the true bitline BLt and a sense amplifier negative reference node SANH, and a second n-type transistor M12 coupled between the sense amplifier negative reference node SANH and the complementary bitline BLc. The first n-type transistor M11 is controlled by the complementary bitline BLc and the second n-type transistor M12 is controlled by the true bitline BLt. The p-type pair includes a first p-type transistor M13 coupled between the true bitline BLt and a sense amplifier positive reference node SAPH, and a second p-type transistor M14 coupled between the sense amplifier positive reference node SAPH and the complementary bitline BLc. The first p-type transistor M13 is controlled by the complementary bitline BLc and the second p-type transistor M14 is controlled by the true bitline BLt.

A first control switch M15 is coupled between the sense amplifier negative reference node SANH and ground GND, and a second control switch M16 is coupled between the sense amplifier positive reference node SAPH and the positive reference voltage VBL. The first control switch M15 and the second control switch M16 are controlled by control signals NSETH, PSETH_n respectively.

In the amplification mode, the control signals NSETH and PSETH_n turn on the respective control switches M15, M16 to enable the holding latch 230 to amplify and latch the differential voltage on the bitlines BLt, BLc. In the offset compensation mode, the control signals NSETH, PSETH_n turn off the respective control switches M15, M16 such that the positive and negative reference nodes SANH, SAPH of the holding latch 230 are floating and thus the holding latch 230 does not actively amplify the bitlines BLt, BLc.

The holding latch 230 may include transistors M11, M12, M13, M14 having higher threshold voltages than the transistors M1, M2, M3, M4 of the primary latch 220. For example, the transistors M11, M12, M13, M14 of the holding latch 230 may have threshold voltages approximately 100 to 200 mV higher than the transistors M1, M2, M3, M4 of the primary latch 220. Based on inherent transistor characteristics, the lower threshold voltage transistors M1, M2, M3, M4 have faster response times but higher leakage current than the higher threshold voltage transistors M11, M12, M13, M14. Thus, the primary latch 220 will respond more quickly to the differential voltage on the differential bitlines BLt, BLc than the holding latch 230, while the holding latch 230 may operate with lower leakage current than the primary latch 220.

Based on the above characteristics, the primary latch 220 may be enabled at least initially after a pre-charge and offset pre-compensation cycle to enable the sense amplifier 200 to rapidly sense and amplify the voltage on the bitlines BLt, BLc based on a response time of the transistors M1, M2, M3, M4 of the primary latch 220. During an active idle state when the wordline remains activated, the primary latch 220 may optionally be disabled (by turning off the control switches M5, M6 via control signals NSET, PSET_n) and decoupled from the bitlines BLt, BLc (by turning off the isolation control switches M7, M8 and the offset pre-compensation control switches M9, M10) to invoke a low leakage mode in which the holding latch 230 operates to maintain the latched bitline voltage without the sense amplifier 200 experiencing the leakage current from the primary latch 220.

The bitline equalization circuit 240 is enabled during the pre-charge cycle to equalize the bitlines BLt, BLc to each other and to the equalization voltage VBLEQ. The equalization voltage VBLEQ may be set to VBL/2, such that when equalized, the bitlines BLt, BLc are halfway between logic levels.

In an embodiment, the bitline equalization circuit 240 comprises a first equalization switch M17 coupled between the true bitline BLt and the equalization voltage VBLEQ, a second equalization switch M18 coupled between the equalization voltage VBLEQ and the complementary bitline BLc, and a third equalization switch M19 coupled between the true bitline BLt and the complementary bitline BLc. The equalization switches M17, M18, M19 (e.g., transistors) are each controlled by an equalization control signal EQL. The first and second equalization switches M17, M18, when turned on, operate to couple the true bitline BLt and complementary bitline BLc respectively to the equalization voltage VBLEQ. The third equalization switch M19 operates to connect the bitlines BLt, BLc to remove offset from the first and second equalization switches M17, M18.

The primary latch equalization circuit 270 is also enabled during the pre-charge cycle and operates to equalize the positive and negative reference nodes SAP, SAN of the primary latch 220 to each other and to the equalization voltage VBLEQ. The primary latch equalization circuit 270 may include a first equalization switch M20 coupled between the sense amplifier positive reference terminal SAP and the equalization voltage VBLEQ, a second equalization switch M21 coupled between the equalization voltage VBLEQ and the sense amplifier negative reference terminal SAN, and a third equalization switch M22 coupled between the sense amplifier positive reference terminal SAP and the sense amplifier negative reference terminal SAN. The switches M20, M21, M22 (e.g., transistors) may be collectively controlled by a sense amplifier equalization control signal SANSAPEQL and may operate similarly to the bitline equalization circuit 240 described above.

The holding latch equalization circuit 260, is similarly enabled during the pre-charge cycle and operates to equalize the positive and negative reference nodes SAPH, SANH of the holding latch 230 to each other and to the equalization voltage VBLEQ. The holding latch equalization circuit 260 may include a first equalization switch M23 coupled between the sense amplifier positive reference terminal SAPH and the equalization voltage VBLEQ, a second equalization switch M24 coupled between the equalization voltage VBLEQ and the sense amplifier negative reference terminal SANH, and a third equalization switch M25 coupled between the sense amplifier positive reference terminal SAPH and the sense amplifier negative reference terminal SANH. The switches M23, M24, M25 (e.g., transistors) may be collectively controlled by a sense amplifier equalization control signal SANSAPEQLH and may operate similarly to the bitline equalization circuit 240 and the primary latch equalization circuit 270 described above.

The column select circuit 250 operates to control coupling between the bitlines BLt, BLc and corresponding data lines LDQt, LDQc via a column select line signal CSL. For example, in a memory read operation, the column select circuit 250 outputs the differential voltage on the bitlines BLt, BLc to the data lines LDQt, LDQc as an output data bit. In a write operation, the column select circuit 250 couples the data lines LDQt, LDQc to provide an input differential voltage to the bitlines BLt, BLc. The column select circuit 250 may be implemented as a first column select switch M26 that couples between the true bitline BLt and the true data line LDQt, and a second column select switch M27 that couples between the complementary bitline BLc and the complementary data LDQc. The column select switches M26, M27 (e.g., transistors) are controlled by the column select line signal CSL.

The various control switches M5-M10, M15-M27 may be implemented as n-type transistors or p-type transistors, such as complementary metal-oxide semiconductor (CMOS) transistors. The various control signals OFS, ISO, NSET, PSET_n, NSETH, PSETH_n, SANSAPEQL, SANSAPHEQL may comprise active high or active low signals. In embodiments where NSET is an active high signal and PSET_n is an active low signal, these signals NSET, PSET_n may be implemented using a single active high or active low signal (e.g., SET or SET_n) that controls both switches M5, M6. Similarly, in embodiments where NSETH is an active high signal and PSETH_n is an active low signal, these signals NSETH, PSETH_n may be implemented using a single active high or active low signal (e.g., SETH or SETH_n) that controls both switches M15, M16.

The various control signals OFS, ISO, NSET, PSET_n, NSETH, PSETH_n, SANSAPEQL, SANSAPHEQL may be generated by sense amplifier control logic 150 as described above. In an embodiment, at least some of the components of the sense amplifier 200 (and corresponding control logic 150) may be shared between two or more sense amplifiers 200 of the memory device 100. For example, in an embodiment, the sense amplifier references nodes SAN, SAP, SANH, SAPH may coupled to two more different sense amplifiers 200. In this case, one set of equalization circuits 260, 270 and latch control switches M5, M6, M15, M16 may perform equalization and control of the reference nodes SAN, SAP, SANH, SAPH coupled to multiple sense amplifiers 200. The various control signals OFS, ISO, NSET, PSET_n, NSETH, PSETH_n, SANSAPEQL, SANSAPHEQL (and corresponding control logic 150), and reference voltages VBL, GND, VBLEQ may similarly be shared by multiple sense amplifiers 200.

Figure 3:
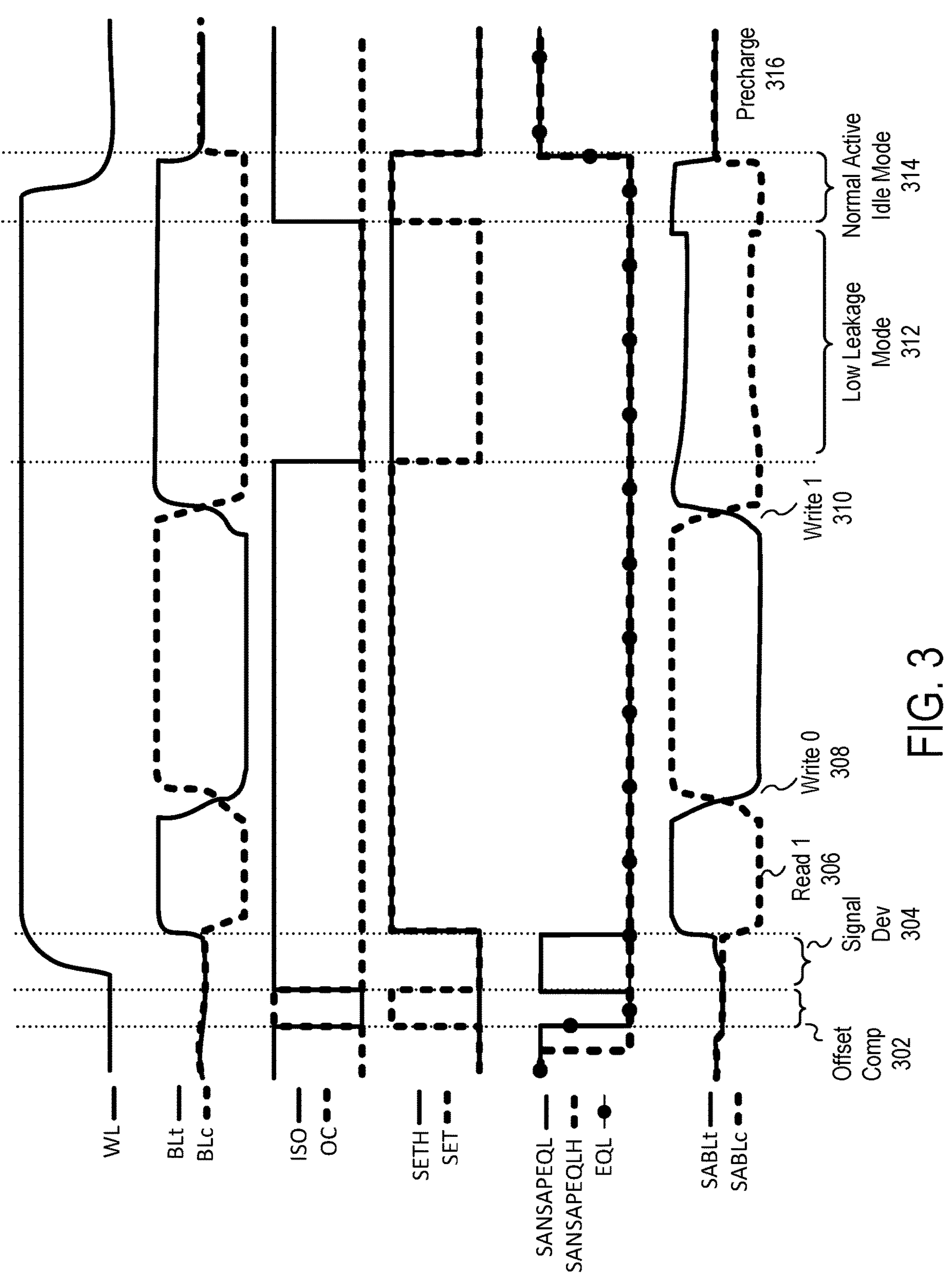
FIG. 3 is a set of waveforms representing example operation of a sense amplifier.

FIG. 3 illustrates a set of example waveforms associated with example operations of the sense amplifier 200. The sense amplifier 200 is configured for offset compensation 302 after a pre-charge cycle while the wordline WL is deactivated. At the start of the offset compensation mode 302, the bitlines BLt, BLc and the sense amplifier bitlines SABLt, SABLc are pre-charged to the equalization voltage VBLEQ (e.g., VBL/2). The isolation control signal ISO turns off the isolation switches M9, M10 and the offset compensation control signal OFS turns on the offset compensation switches M7, M8, thus connecting the bitlines BLt, BLc, and the sense amplifier bitlines SABLt, SABLc with reversed polarity. The primary latch control signals NSET, PSET_n (represented in the waveforms as a single active high signal SET) turn on the primary latch control switches M5, M6 to connect the primary latch reference nodes SAN, SAP to the respective reference voltages VBL, GND and set the primary latch 220. The primary latch 220 amplifies the differential voltage on the sense amplifier bitlines SABLt, SABLc to generate a pre-compensation offset on the sense amplifier bitlines SABLt, SABLc. The equalization control signals EQL, SANSAPEQL, SANSAPEQLH turn off the respective equalization circuits 240, 260, 270 during offset compensation 302.

In a signal development phase 304, the isolation control signal ISO turns on the isolation switches M9, M10 and the offset compensation control signal OFS turns off the offset compensation switches M7, M8, thus connecting the bitlines BLt, BLc, and the sense amplifier bitlines SABLt, SABLc with matched polarity. The primary latch control signal SET turn off the primary latch control switches M5, M6 to cause the primary latch reference nodes SAN, SAP to float such that the primary latch 220 does not actively perform amplification. The equalization control signal SANSAPEQL may turn on the primary latch equalization circuit 270 in this stage to re-equalize the primary latch reference nodes SAN, SAP The wordline WL is activated.

After the signal development phase 304, the primary latch control signal SET and holding latch control signal SETH turn on the control switches M5, M6 and M15, M16 of the primary latch 220 and the holding latch 230 respectively to set the latches 220, 230 and enable amplification of the bitline voltage on the bitlines BLt, BLc. The equalization control signal SANSAPEQL also turns off the primary latch equalization circuit 270.

Following signal development 304, one or more memory operations may be performed. In this example, the sense amplifier 200 sequentially performs a read 306 of a logic 1 bit, a write 308 of a logic 0 bit, and a write 310 of a logic 1 bit. The logic levels of the read and write bit are represented by the true bitline BLt (which is connected with the true sense amplifier bitline SABLt).

Following the memory operations 306, 308, 310, the sense amplifier 200 enters an active idle mode. In this example, a low leakage mode 312 is turned on followed by a normal active idle mode 314. In the low leakage mode 312, the primary latch control signal SET turns off the primary latch control switches M5, M6 to cause the primary latch reference nodes SAN, SAP to float. The isolation control signal ISO and the offset compensation control signal OFS configure the respective control switches M7, M8, M9, M10 in the off-state so that the sense amplifier bitlines SABLt, SABLc are also floating. This state effectively decouples the primary latch and enables operation of the sense amplifier without leakage current through the primary latch transistors M1, M2, M3, M4. The holding latch 230 remains set to hold the latched bitline voltage on the bitlines BLt, BLc. The low leakage mode 312 may be exited to a normal idle mode 314 by the isolation control signal ISO turning the isolation control switches M9, M10 back on and reactivating the primary latch 220 via the primary latch control signal SET.

After the wordline WL is deactivated, the sense amplifier 200 initiates a pre-charge mode 316. Here, the primary latch control signal SET and holding latch control signal SETH turn off the respective latches 220, 230 and the equalization circuits 240, 260, 270 are activated via their respective control signals EQL, SANSAPEQL, SANSAPEQLH, to perform equalization of the bitlines BLt, BLc and the reference nodes SAN, SAP, SANH, SAPH.

The waveforms in FIG. 3 show the various control signals ISO, OC, SET, (representing NSET, PSET_n as complementary signals), SETH (representing NSETH, PSETH_n as complementary signals), SANSAPEQL, SANSAPEQLH, EQL as active high signals. In other embodiments, one or more of these control signals may instead be implemented as active low signals.

Figure 4:
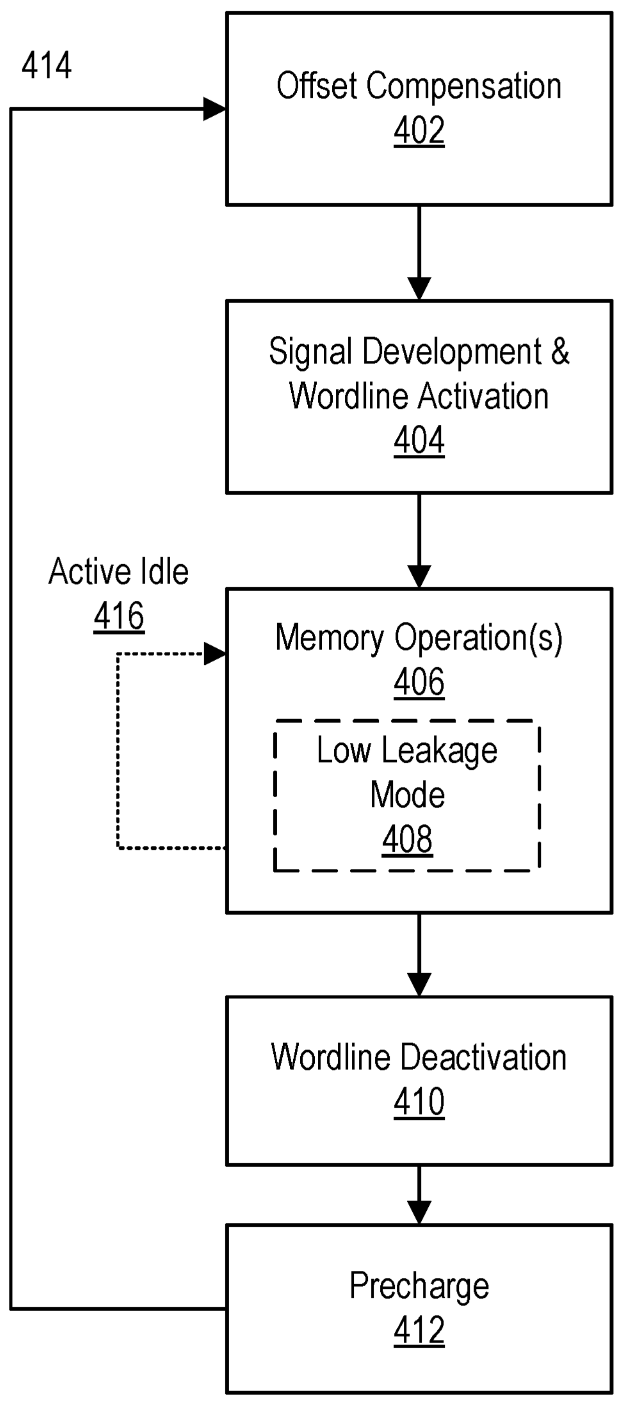
FIG. 4 is a flow chart illustrating an example process for operating a sense amplifier of a memory device.

FIG. 4 illustrates an example embodiment of a process for operating a sense amplifier 200. Beginning from a pre-charged state, the sense amplifier 200 enters an offset compensation mode 402. In this mode, the offset compensation control signal OFS and isolation control signal ISO control the connectivity control circuit 210 to connect the sense amplifier bitlines SABLt, SABLc for offset pre-compensation. The primary latch control signals NSET, PSET_n turn off the primary latch 220 by floating the reference nodes SAP, SAN, and the holding latch control signals NSETH, PSETH_n turn off the holding latch 230 by floating the reference nodes SAPH, SANH. The equalization circuits 240, 260, 270 are also turned off via their respective control signals EQL, SANSAPEQL, SANSAPEQLH.

In the signal development and wordline activation phase 404, the sense amplifier prepares for wordline activation. The connectivity control circuit 210 is controlled to connect the sense amplifier bitlines SABLt, SABLc for amplification. The primary latch control signals NSET, PSET_n turn off the primary latch 220, and the primary latch equalization circuit SANSAPEQL is turned on to equalize the reference nodes SAN, SAP of the primary latch 220. The wordline WL is then activated.

For memory operations 406, the primary latch equalization circuit 270 is turned back off via control signal SANSAPEQL and both the primary latch 220 and holding latch 230 are turned on for amplification via their respective control signals NSET, PSET_n, NSETH, PSETH_n. The sense amplifier 200 may remain in this configuration for one or more read and/or write operations.

The sense amplifier 200 may operate in an active idle mode 416 between memory operations while the wordline remains active. The sense amplifier 200 may employ a low leakage mode 408 for active idle 416 by configuring the connectivity control circuit 210 to decouple the primary latch 220 from the bitlines BLt, BLc and turning off the primary latch 220 via the primary latch control signals PSET_n, NSET. In this mode, the holding latch 230 operates to maintain the bitline voltage on the bitlines BLt, BLc. The sense amplifier 200 may optionally exit the low leakage mode 408 and operate in a normal active idle mode by configuring the connectivity control circuit 210 to reconnect the primary latch 220 to the bitlines BLt, BLc in the amplification configuration and turning on the primary latch 220 via the primary latch control signals PSET_n, NSET. The sense amplifier 200 may perform any number of consecutive memory operations and may operate in either the normal active idle mode or low leakage mode 408 in between memory operations while the wordline WL remains active. When reading from or writing to the sense amplifier 200, either the primary latch 220, the holding latch 230, or both might be active.

After wordline deactivation 410, the sense amplifier performs a pre-charge cycle 412. Here, the primary latch 220 and holding latch 230 are turned off via their respective control signals PSET_n, NSET, PSETH_n, NSETH and the equalization control signals EQL, SANSAPEQL, SANSAPEQLH activate the equalization circuits 240, 260 270 to equalize the bitlines BLt, BLc, the reference nodes of the primary latch SAP, SAN, and the reference nodes of the holding latch SAPH, SANH. The process may repeat 414 for subsequent memory operations.

In an embodiment, the above-described memory device 100 including the sense amplifier 200 may be deployed in a memory system including a memory controller that controls memory operations of one or more such memory devices. Memory devices may be organized in one or more memory modules (e.g., dual-inline memory modules (DIMMs)) controlled by a controller. The memory controller and the one or more memory devices may be co-located (e.g., in a computing device) or a memory controller may control one or more remote and/or distributed memory devices over a network.

A memory system including the described memory device 100 may be deployed in various types of computing systems. For example, an embodiment of such a memory device 100 may be deployed in an augmented reality or virtual reality headset. Such systems typically handle many different tasks concurrently with different memory access patterns and may therefore utilize the low leakage active idle capability of the described memory device 100 to avoid undesired power consumption. In other embodiments, the described memory device 100 may be deployed in various other computing systems that utilize active idle modes.

Upon reading this disclosure, those of ordinary skill in the art will appreciate still alternative structural and functional designs and processes for the described embodiments, through the disclosed principles of the present disclosure. Thus, while embodiments and applications of the present disclosure have been illustrated and described, it is to be understood that the disclosure is not limited to the precise construction and components disclosed herein. Various modifications, changes and variations which will be apparent to those skilled in the art may be made in the arrangement, operation and details of the method and apparatus of the present disclosure herein without departing from the scope of the disclosure as defined in the appended claims.

What is claimed is:

1. A sense amplifier for a memory device, the sense amplifier comprising:
- a primary latch comprising a first set of transistors to latch a differential bitline voltage of a pair of bitlines in association with a memory operation;
- a holding latch comprising a second set of transistors to latch the differential bitline voltage of the pair of bitlines, wherein the second set of transistors have higher threshold voltages than the first set of transistors; and
- control circuitry for independently controlling connectivity of the primary latch and the holding latch, wherein the control circuitry includes a connectivity control circuit configurable between at least a first connectivity configuration of the primary latch associated with performing offset pre-compensation to precondition the primary latch based on an offset of the first set of transistors, and a second connectivity configuration associated with the primary latch performing amplification of the differential bitline voltage.

2. The sense amplifier of claim 1, wherein in the first connectivity configuration, the connectivity control circuit couples the pair of bitlines to a pair of sense amplifier bitlines of the primary latch with reversed polarity via a set of offset compensation control switches, and wherein in the second connectivity configuration the connectivity control circuit couples the pair of bitlines to the pair of sense amplifier bitlines of the primary latch with matched polarity via a set of isolation control switches.

3. The sense amplifier of claim 2, wherein the control circuitry further includes a set of primary latch control switches to couple reference nodes of the primary latch to respective reference voltages when performing the amplification following wordline activation and when performing the offset pre-compensation, and to decouple the reference nodes of the primary latch from the respective reference voltages during a signal development phase in between the offset pre-compensation and the wordline activation.

4. The sense amplifier of claim 2, wherein the connectivity control circuit furthermore turns off the offset compensation control switches and the isolation control switches in active idle mode in which the primary latch is decoupled from the pair of bitlines.

5. The sense amplifier of claim 4, wherein the control circuitry further includes a set of primary latch control switches to decouple reference nodes of the primary latch from respective reference voltages in the active idle mode.

6. The sense amplifier of claim 1, wherein the control circuitry further includes a set of holding latch control switches to decouple reference nodes of the holding latch from respective reference voltages when performing the offset pre-compensation and to couple the reference nodes of the holding latch to the respective reference voltages when performing the amplification.

7. The sense amplifier of claim 1, further comprising:
a bitline equalization circuit to equalize the pair of bitlines during a pre-charge mode prior to performing the offset pre-compensation;
a primary latch equalization circuit to equalize reference nodes of the primary latch during the pre-charge mode; and
a holding latch equalization circuit to equalize reference nodes of the holding latch during the pre-charge mode.

8. The sense amplifier of claim 1, further comprising:
a column select circuit to couple or decouple the pair of bitlines with a corresponding pair of data lines.

9. A memory device comprising:
an array of memory cells;
a set of word lines to control activation of respective rows of the array;
a set of bitline pairs coupled to respective columns of the array for facilitating read and write operations with respect to activated cells of the respective columns;
a set of sense amplifiers to sense differential voltages of the sets of bitlines, where a sense amplifier comprises:
a primary latch comprising a first set of transistors to latch a differential bitline voltage of a pair of bitlines in association with a memory operation;
a holding latch comprising a second set of transistors to latch the differential bitline voltage of the pair of bitlines, wherein the second set of transistors have higher threshold voltages than the first set of transistors; and
control circuitry for independently controlling operation of the primary latch and the holding latch, wherein the control circuitry includes a connectivity control circuit configurable between at least a first connectivity configuration of the primary latch associated with performing offset pre-compensation to precondition the primary latch based on an offset of the first set of transistors, and a second connectivity configuration associated with the primary latch performing amplification of the differential bitline voltage.

10. The memory device of claim 9, wherein in the first connectivity configuration, the connectivity control circuit couples the pair of bitlines to a pair of sense amplifier bitlines of the primary latch with reversed polarity via a set of offset compensation control switches, and wherein in the second connectivity configuration the connectivity control circuit couples the pair of bitlines to the pair of sense amplifier bitlines of the primary latch with matched polarity via a set of isolation control switches.

11. The memory device of claim 10, wherein the control circuitry further includes a set of primary latch control switches to couple reference nodes of the primary latch to respective reference voltages when performing the amplification following wordline activation and when performing the offset pre-compensation, and to decouple the reference nodes of the primary latch from the respective reference voltages during a signal development phase in between the offset pre-compensation and the wordline activation.

12. The memory device of claim 10, wherein the connectivity control circuit furthermore turns off the offset compensation control switches and the isolation control switches in an active idle mode in which the primary latch is decoupled from the pair of bitlines.

13. The memory device of claim 9, wherein the control circuitry further includes a set of holding latch control switches to decouple reference nodes of the holding latch from respective reference voltages when performing the offset pre-compensation and to couple the reference nodes of the holding latch to the respective reference voltages when performing the amplification.

14. A method for operating a sense amplifier of a memory device, the method comprising:
prior to activation of a wordline of a memory array, configuring the sense amplifier for an offset compensation mode by turning on a pair of offset compensation control switches and turning off a pair of isolation switches to couple a pair of bitlines to a pair of sense amplifier bitlines of a primary latch with reversed polarity;
operating the sense amplifier in the offset compensation mode to perform offset pre-compensation of the primary latch;
while the wordline is activated, operating the sense amplifier in an amplification mode in which the primary latch and a holding latch amplify a differential voltage of the pair of bitlines in association with a memory access operation, wherein the primary latch comprises a first set of transistors and the holding latch comprises a second set of transistors having higher threshold voltages than the first set of transistors; and
following the memory access operation while the wordline remains activated, operating the sense amplifier in an active idle mode in which control switches of the primary latch are off to decouple the primary latch from its reference voltages and from the bitlines, and in which the holding latch holds the differential voltage of the pair of bitlines.

15. The method of claim 14, further comprising:
configuring the sense amplifier for the amplification mode by turning off a pair of offset compensation control switches and turning on a pair of isolation switches to couple the pair of bitlines to a pair of sense amplifier bitlines of the primary latch with matched polarity.

16. The method of claim 15, further comprising:
configuring the sense amplifier for the active idle mode by operating the pair of offset compensation control switches and the pair of isolation switches in off states to decouple the sense amplifier bitlines of the primary latch from the pair of bitlines.

17. The method of claim 14, further comprising:
deactivating the wordline; and
performing a pre-charge cycle to equalize the pair of bitlines and reference nodes of the primary latch and the holding latch.

* * * * *